US012610860B2

(12) United States Patent
Huh et al.

(10) Patent No.: US 12,610,860 B2
(45) Date of Patent: Apr. 21, 2026

(54) MULTI-CHIP STACKING METHOD

(71) Applicant: SAMSUNG ELECTRONICS CO., LTD., Suwon-si (KR)

(72) Inventors: Yeunhee Huh, Namyangju-si (KR); Chisung Bae, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 820 days.

(21) Appl. No.: 17/863,568

(22) Filed: Jul. 13, 2022

(65) Prior Publication Data

US 2023/0230955 A1     Jul. 20, 2023

(30) Foreign Application Priority Data

Jan. 18, 2022     (KR) ........................ 10-2022-0007404

(51) Int. Cl.
| | |
|---|---|
| H01L 25/065 | (2023.01) |
| H01L 23/48 | (2006.01) |
| H01L 25/00 | (2006.01) |

(52) U.S. Cl.
CPC ........ H01L 25/0652 (2013.01); H01L 23/481 (2013.01); H01L 25/50 (2013.01); *H01L 2225/06541* (2013.01)

(58) Field of Classification Search
CPC .... H01L 25/0652; H01L 23/481; H01L 25/50
See application file for complete search history.

(56) References Cited

U.S. PATENT DOCUMENTS

| | | | |
|---|---|---|---|
| 7,402,911 B2 * | 7/2008 | Thomas .............. | H01L 23/3128 |
| | | | 257/713 |
| 9,379,063 B2 | 6/2016 | Nomoto et al. | |
| 10,170,399 B2 * | 1/2019 | Ho .................... | H01L 23/49827 |
| 11,251,155 B2 | 2/2022 | Lee et al. | |
| 11,562,983 B2 * | 1/2023 | Chen .................... | H01L 25/105 |

(Continued)

FOREIGN PATENT DOCUMENTS

| | | |
|---|---|---|
| JP | 2015-32811 A | 2/2015 |
| KR | 10-2011-0137565 A | 12/2011 |

(Continued)

OTHER PUBLICATIONS

Tsugawa, H., et al. "Pixel/DRAM/logic 3-layer stacked CMOS image sensor technology." 2017 IEEE International Electron Devices Meeting (IEDM). IEEE, 2017, (4 pages in English).

(Continued)

*Primary Examiner* — Thao P Le

(74) *Attorney, Agent, or Firm* — NSIP Law

(57)     ABSTRACT

An integrated circuit having a plurality of stacked chips, and a method of manufacturing thereof are provided. The integrated circuit includes a substrate, a plurality of chips stacked on a printed circuit board, wherein each of the plurality of chips includes a plurality of circuits, and a plurality of interconnects configured to electrically connect each of the plurality of circuits included in the each of the plurality of chips to the substrate, wherein the plurality of chips are unconnected with regard to each other, and are stacked such that areas of each of the plurality of chips, to which the plurality of interconnects are connected, are disposed in a non-overlapping manner with each other.

10 Claims, 8 Drawing Sheets

(56)                References Cited

U.S. PATENT DOCUMENTS

| | | | |
|---|---|---|---|
| 2011/0230012 A1* | 9/2011 | Hsu ..................... | H01L 21/563 |
| | | | 438/108 |
| 2011/0309468 A1 | 12/2011 | Oh et al. | |
| 2012/0056178 A1* | 3/2012 | Han .................... | H01L 23/5256 |
| | | | 257/E23.002 |
| 2013/0279276 A1* | 10/2013 | Schaefer ................. | G11C 7/00 |
| | | | 365/189.011 |
| 2015/0021761 A1* | 1/2015 | Park ................... | H01L 25/0657 |
| | | | 257/737 |
| 2017/0186728 A1* | 6/2017 | Chainer ................. | H01L 24/73 |
| 2019/0004909 A1* | 1/2019 | Alameer ................. | G11C 5/02 |
| 2020/0066640 A1* | 2/2020 | Sarkar .................... | H01L 24/97 |
| 2021/0144324 A1* | 5/2021 | Hynecek ................ | H10F 39/18 |
| 2021/0366847 A1* | 11/2021 | Eom ...................... | H01L 24/73 |
| 2022/0037285 A1* | 2/2022 | Noh ....................... | H01L 24/85 |
| 2022/0414435 A1 | 12/2022 | Lee et al. | |
| 2023/0197595 A1* | 6/2023 | Sakuma ............ | H01L 23/49816 |
| | | | 257/690 |

FOREIGN PATENT DOCUMENTS

| | | |
|---|---|---|
| KR | 10-2016-0076195 A | 6/2016 |
| KR | 10-2018-0099065 A | 9/2018 |
| KR | 10-2020-0138493 A | 12/2020 |
| KR | 10-2264548 B1 | 6/2021 |
| KR | 10-2021-0080928 A | 7/2021 |
| KR | 10-2021-0098728 A | 8/2021 |

OTHER PUBLICATIONS

Korean Office Action issued on Aug. 10, 2025, in corresponding Korean Patent Application No. 10-2022-0007404. (4 pages in English, 7 pages in Korean).

* cited by examiner

160

180

170

150

MULTI-CHIP STACKING METHOD

CROSS-REFERENCE TO RELATED APPLICATION

This application claims the benefit under 35 USC § 119(a) of Korean Patent Application No. 10-2022-0007404, filed on Jan. 18, 2022, in the Korean Intellectual Property Office, the entire disclosure of which is incorporated herein by reference for all purposes.

BACKGROUND

1. Field

The following description relates to a multi-chip stacking method.

2. Description of Related Art

As chips have been reduced in size and weight, three-dimensional integrated circuits that achieve high-speed/wide-band input/output (I/O) transmission are being implemented. By implementing an electronic circuit including a semiconductor chip or a semiconductor chip package through stacking technology, the degree of integration and signal transmission characteristics may be improved. There are two schemes, that is, a bonding wire scheme and a through-silicon via (TSV) scheme, to connect a plurality of stacked semiconductor chips to each other, and when implementing the TSV scheme, a wiring distance may be significantly reduced so that an element may be miniaturized and driven with a high speed and low power.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an integrated circuit includes a substrate; a plurality of chips stacked on the substrate, wherein each of the plurality of chips comprises a plurality of circuits; and a plurality of interconnects configured to electrically connect each of the plurality of circuits comprised in each of the plurality of chips to the substrate, wherein the plurality of chips are unconnected with regard to each other, and are stacked such that areas of each of the plurality of chips, to which the plurality of interconnects are connected, are disposed in a non-overlapping manner with each other.

A number of the plurality of interconnects is determined based on a number of the plurality of chips and a number of the plurality of circuits.

The plurality of chips may be configured to rotate or flip, and are stacked such that the areas of each of the plurality of chips are disposed in a non-overlapping manner with each other.

Each of the plurality of interconnects may include a plurality of through-silicon vias (TSVs).

The plurality of chips may include identical single chips.

The plurality of chips may include a plurality of multi-chip sets.

In a general aspect, a chip includes a chip body including a first area and a second area; and a plurality of circuits disposed in the first area, and configured to connect to a plurality of interconnects, wherein the second area may be virtually divided into a plurality of split areas, and the plurality of interconnects and the plurality of circuits are connected in a connecting area of the second area corresponding to one of the plurality of split areas.

The second area may be equally divided into the plurality of split areas.

A number of stackable chips may correspond to a number of the plurality of split areas.

The plurality of interconnects may include a plurality of through-silicon vias (TSVs).

An integrated circuit manufacturing method includes manufacturing a plurality of chips and stacking the plurality of chips on a substrate; and electrically connecting each of a plurality of circuits comprised in each of the plurality of chips to the substrate with a plurality of interconnects, wherein the manufacturing of the plurality of chips comprises stacking the plurality of chips such that areas of each of the plurality of chips, to which the plurality of interconnects are connected, are disposed in a non-overlapping manner with each other, and wherein the plurality of chips are unconnected with regard to each other.

A number of the plurality of interconnects may be determined based on a number of the plurality of chips and a number of the plurality of circuits.

The manufacturing of the plurality of chips may include rotating or flipping each of the plurality of chips, and stacking the plurality of chips such that the areas of each of the plurality of chips are disposed in a non-overlapping manner with each other.

Each of the plurality of interconnects may include a plurality of through-silicon vias (TSVs).

The plurality of chips may include identical single chips.

The plurality of chips may include a plurality of multi-chip sets.

Other features and aspects will be apparent from the following detailed description, the drawings, and the claims.

Figure 1A:
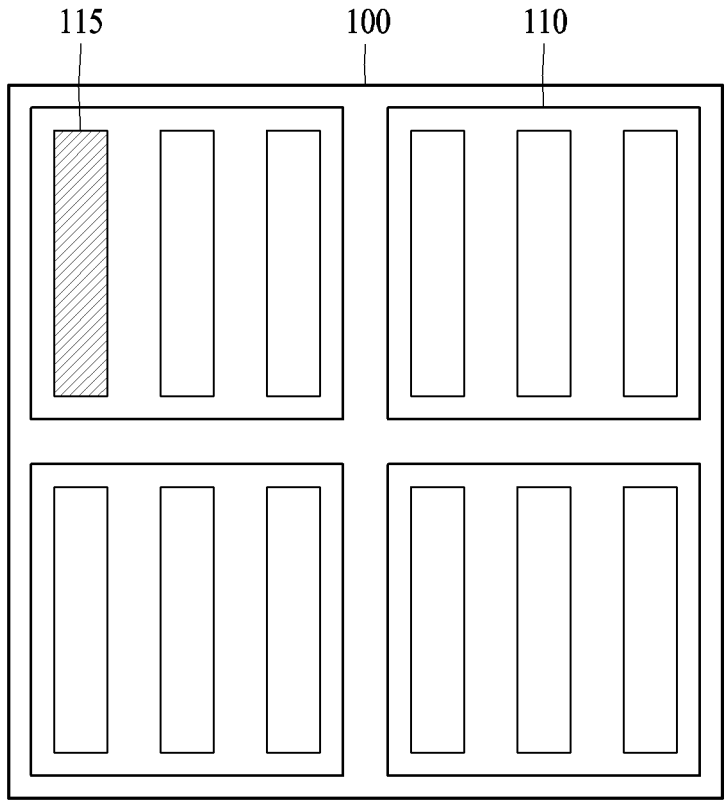
FIGS. 1A and 1B illustrate examples of increasing a number of sensing channels, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

In addition, terms such as first, second, A, B, (a), (b), and the like may be used herein to describe components. Each of these terminologies is not used to define an essence, order, or sequence of a corresponding component but used merely to distinguish the corresponding component from other component(s).

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

One or more examples relate to an integrated circuit in which a plurality of chips are stacked and a manufacturing method thereof.

The examples may be implemented as various types of products, such as, as non-limiting examples, a personal computer (PC), a laptop computer, a tablet computer, a smartphone, a television (TV), a smart home appliance, an intelligent vehicle, a kiosk, and a wearable device.

Hereinafter, examples will be described in detail with reference to the accompanying drawings. In the drawings, like reference numerals are used for like elements.

In a technical field that implement a plurality of identical chips, such as a complementary metal-oxide-semiconductor (CMOS) image sensor, a bio-signal sensor, a display driving circuit, and a touch sensor, scalability of a number of sensing channels is important. Prior to describing example methods of increasing a number of sensing channels, a typical method to increase the number of sensing channels will be described with reference to FIGS. 1A and 1B.

Figure 1B:
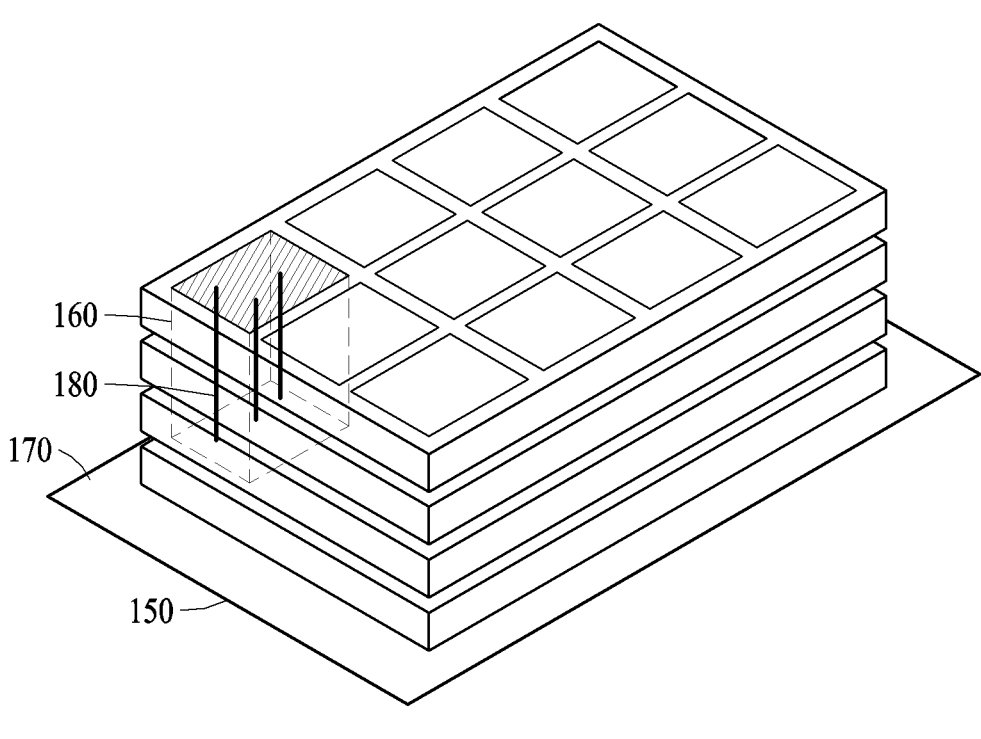

FIGS. 1A and 1B illustrate examples of typical methods of increasing a number of sensing channels.

Referring to FIG. 1A, a first integrated circuit 100 may be provided with a plurality of single chips 110 two-dimensionally disposed on a substrate. Additionally, a single chip 110 may include a plurality of circuits 115. In an example, the single chip 110 may include N circuits (although three circuits are illustrated in each chip 110 in FIG. 1A, this is merely an example, and a number of circuits may be variously adopted), and the first integrated circuit 100 may include M single chips (although four single chips are illustrated in FIG. 1A, this is merely an example, and a number of single chips may be variously adopted). In this example, the first integrated circuit 100 may have N*M (for example, 3*4=12) channels.

However, in implementing the first integrated circuit 100, the complexity of a number of routings may increase, and due to a large substrate area, a small system may not be readily manufactured.

Referring to FIG. 1B, a second integrated circuit 150 may include a three-dimensional stack of M types of chips 160 constructing N*M sub-circuits on a substrate 170 to increase a number of channels.

While each of the plurality of circuits 115 included in the single chip 110 of FIG. 1A may independently and completely perform its function, each of the sub-circuits included in the M types of chips (although 4 types of chips are illustrated in FIG. 1B, this is merely an example, and a number of chips may be variously adopted) that construct N*M (although 3*4 sub-circuits are illustrated in FIG. 1B, this is merely an example, and a number of sub-circuits may be variously adopted) sub-circuits of FIG. 1B includes only a part of the components. In an example, each of sub-circuits included in 4 types of chips may include one-fourth of the components, and accordingly, four 4 types of chips may have to be connected to each other to construct one channel. That is, the second integrated circuit 150 including the M types (e.g., 4 types) of chips 160 that construct N*M (e.g., 3*4) sub-circuits may have N*M (e.g., 3*4=12) channels.

The M types of chips 160 may be connected to each other via a through-silicon via (TSV) 180. A 3 Dimensional (3D) TSV integrated circuit (IC), which is one of 3D IC technologies, is a package in a form of chips including, 2 dimensional plane chips that are vertically stacked and connected by implementing the TSV to maximize a number of transistors per a single area and minimize development costs and time. By implementing the 3D TSV IC, chips with various functions may be stacked in a single package to implement a high-integration and multifunctional package.

The 3D TSV IC is key technology for a next-generation system in package (SiP) that meets the needs of an era to produce high-performance, high-integration, and low-power products. The 3D TSV IC is a package that may improve system performance, which was limited by existing package technology, and may be significantly advantageous in terms of system miniaturization by realizing a degree of integration of a transistor close to Moore's Law without expensive process development.

The TSV is technology, which has a structure in which a transistor or connection lines formed on an upper surface of a chip are connected to a lower surface of the chip, and a structure through via structure on a substrate maybe implemented to three-dimensionally stack semiconductor chips. Since the example TSV may implement a structure of vertically connecting chips through an interior of a wafer rather than detouring outside the chip, a shortest distance from one chip to another chip or a substrate may be formed. An advantage of a shortest connection distance in the connection of a first chip with a second chip is that a signal loss may be reduced so that high-speed and low-power communication between chips may be performed, making it possible to implement a high-performance 3D IC SiP. Additionally, when implementing the TSV for a power line, low-power structure for an off-chip driver may be realized, which may increase usage time of mobile electronic products, thereby achieving marketability of electronic products.

However, in an example of constructing the second integrated circuit 150, a size of a pixel may be restricted and nodes inside a single channel may be connected with the TSV, and thus, there may be issues that the scheme may not be applicable to a circuit that is vulnerable to parasitic elements, and that once a chip is manufactured the chip may not readily expand.

As described in detail below, according to a multi-chip stacking method, a single chip having a predetermined number of channels may be three-dimensionally stacked, reducing parasitic elements of nodes inside a single channel, and as a routing length is short, performance of a circuit may be improved, and therefore, the multi-chip stacking method has a great advantage in terms of system miniaturization.

Figure 2A:
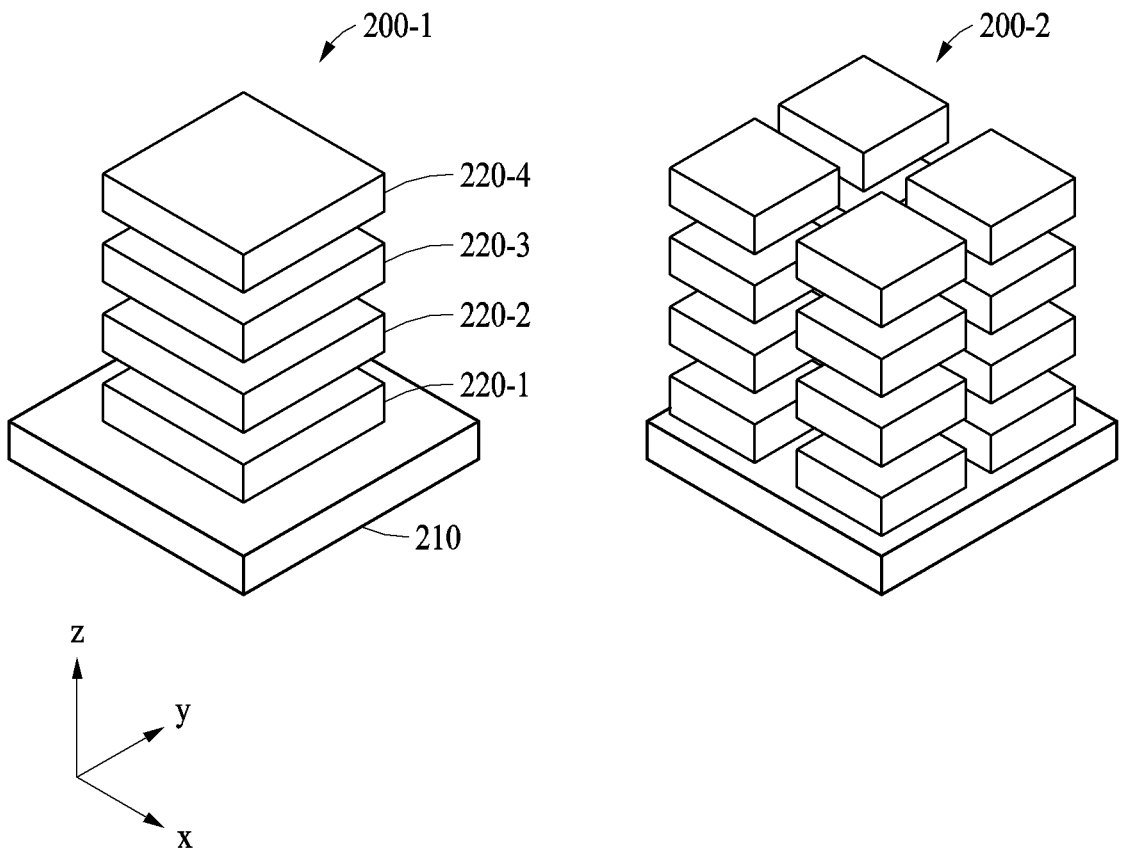
FIG. 2A is a perspective view of an example integrated circuit, in accordance with one or more embodiments.

FIG. 2A illustrates a perspective view of an example integrated circuit, in accordance with one or more embodiments.

Referring to FIG. 2A, an integrated circuit 200-1 may include a substrate 210, a plurality of chips 220-1 to 220-4 stacked on the substrate 210, and a plurality of interconnects that electrically connect each of a plurality of circuits included in each of the plurality of chips 220-1 to 220-4 to the substrate 210. In a non-limited example, the integrated circuit 200-1 may be a sensing device. In a non-limited example, the plurality of interconnects may be TSVs.

In an example, the substrate 210 may be a medium that transmits and receives an electrical signal to and from a source that is external to a chip. The substrate 210 may include a printed circuit board (PCB) and an electrode array. In an example, when the integrated circuit 200-1 is implemented as a touch sensor or an image sensor, the substrate 210 may be a PCB. Alternatively, when the integrated circuit 200-1 is implemented as a neural signal sensor, the substrate 210 may be an electrode array. However, these are only examples, and the substrate 210 is not limited to the above examples, and may include various other media that transmits and receives electrical signals to and from a source that is external to a chip.

The plurality of chips 220-1 to 220-4 may be implemented such that up to four identical single chips may be stacked in a first direction (e.g., a +z direction). However, although FIG. 2A illustrates that four identical single chips are vertically stacked on the substrate 210, this is merely an example, and a minimum or maximum number of stackable chips may vary.

In an example, the integrated circuit 200-1 may be similar to the second integrated circuit 150 of FIG. 1B in that the chips may be vertically stacked. However, each of the M types of the chips 160 included in the second integrated circuit 150 of FIG. 1B may be connected with the TSV 180 to construct one complete circuit, and the plurality of chips 220-1 to 220-4 included in the integrated circuit 200-1 may not be connected to each other, but each of the plurality of chips 220-1 to 220-4 may be independently connected to the substrate 210. A detailed scheme of connecting the plurality of chips 220-1 to 220-4 to the substrate 210 will be described with reference to FIG. 2B.

Furthermore, in one or more examples, a plurality of stacked chips may be further added on the substrate 210 in a second direction and a third direction (e.g., a +x direction and a +y direction). In an example, four stacked chips may be further added on the substrate 210 in the second direction and the third direction (e.g., the +x direction and the +y direction) Accordingly, a total of 16 chips may be disposed in an integrated circuit 200-2. However, this is only an example, and a total of more than 16 chips or less than 16 chips may be disposed in an integrated circuit 200-2.

Figure 2B:
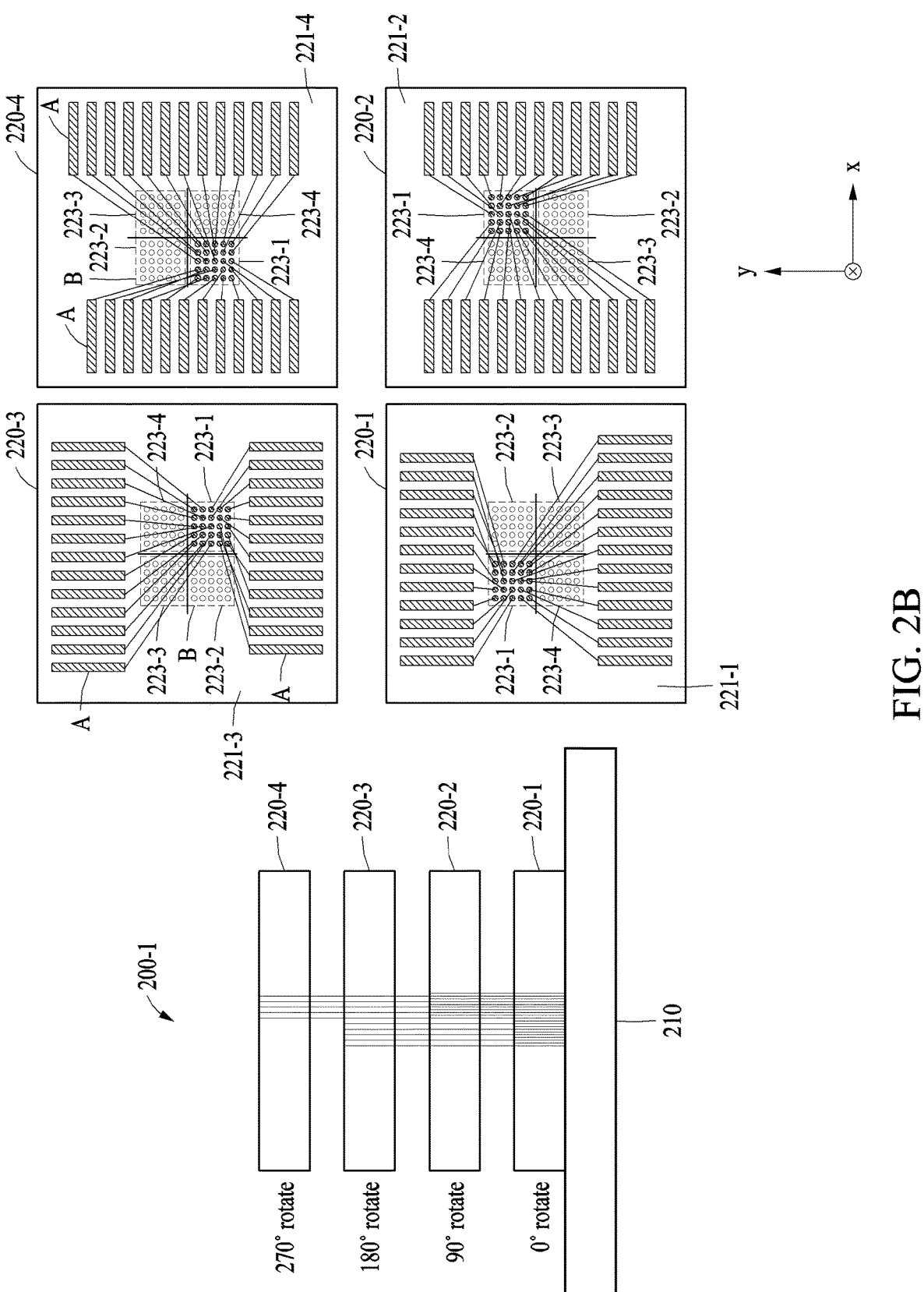
FIG. 2B is a front view of an example integrated circuit, in accordance with one or more embodiments.

FIG. 2B illustrates a front view of an example integrated circuit, in accordance with one or more embodiments.

Referring to FIG. 2B, in a non-limiting example, all of the plurality of chips 220-1 to 220-4 of the integrated circuit 200-1 may be identical chips. The plurality of chips 220-1 to 220-4 having identical structures and components may rotate to be stacked in the integrated circuit 200-1. Prior to describing a method of stacking the plurality of chips 220-1 to 220-4, structures and components of the plurality of chips 220-1 to 220-4 will be described.

Each of the plurality of chips 220-1 to 220-4 may include chip bodies including a first area A and a second area B, and 25 circuits disposed in the first area of the chip bodies 221-1 to 221-4 and connected to 25 interconnects. Although FIG. 2B illustrates 25 circuits and 25 interconnects, this is merely an example, and the number of circuits and the number of interconnects may vary.

The second area B may be virtually divided into a plurality of split areas, and a plurality of interconnects and a plurality of circuits may be connected in a connecting area corresponding to one of the plurality of split areas.

In an example, the second area B of each of the plurality of chips 220-1 to 220-4 which may be implemented to be stacked up to four chips, as only an example, may be virtually divided into four split areas 223-1 to 223-4, and 25 interconnects and 25 circuits may be connected on a one-to-one basis in the connecting area 223-1 corresponding to one of the four split areas 223-1 to 223-4.

The plurality of chips 220-1 to 220-4 may rotate to be stacked such that each of the connecting areas 223-1 do not overlap. Rotation may refer to an operation in which a chip rotates in a preset direction (e.g., clockwise or counterclockwise) with respect to a preset axis (e.g., a z axis).

In an example, when the first chip 220-1, the second chip 220-2, the third chip 220-3, and the fourth chip 220-4 are stacked in a first direction (e.g., a +z direction) and the first chip 220-1 is rotated by 0 degrees, the second chip 220-2 may be rotated (e.g., clockwise or counterclockwise with respect to the z axis) by 90 degrees to be stacked, the third chip 220-3 may be rotated by 180 degrees to be stacked, and the fourth chip 220-4 may be rotated by 270 degrees to be stacked, and thus, the plurality of chips 220-1 to 220-4 may be stacked without the connecting areas 223-1 overlapping each other.

According to the multi-chip stacking method, a single chip having a predetermined number of channels may be three-dimensionally stacked so that the multi-chip stacking method may achieve an advantage by increasing the number of channels. Furthermore, according to the multi-chip stacking method, parasitic elements of nodes inside a single channel may be reduced, and since a routing length is short, the performance of the circuit may be improved, and therefore, the multi-chip stacking method may have a great advantage in terms of system miniaturization.

Figure 3A:
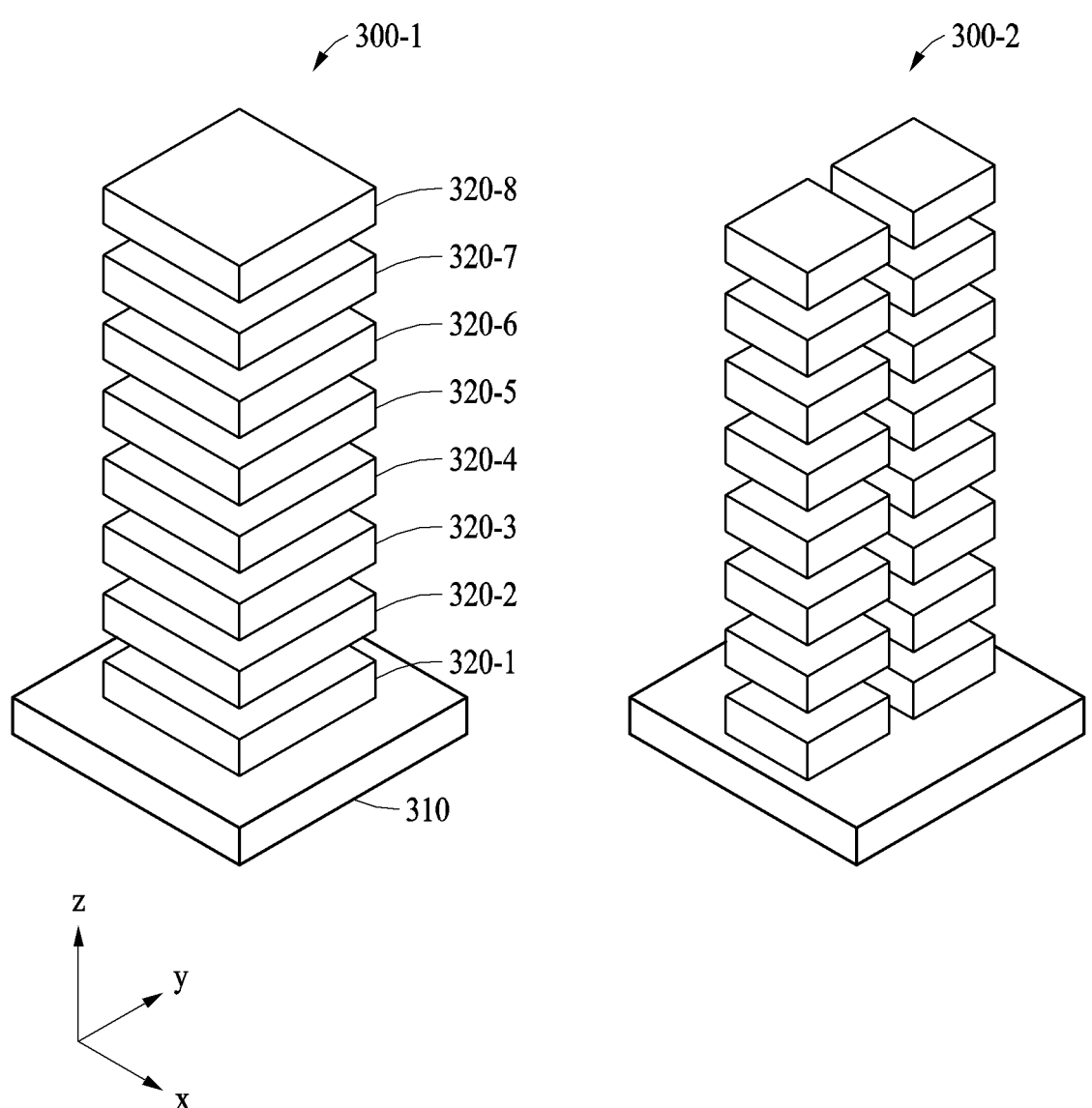
FIG. 3A is a perspective view of an example integrated circuit, in accordance with one or more embodiments.

FIG. 3A illustrates a perspective view of an example integrated circuit, in accordance with one or more embodiments.

Referring to FIG. 3A, an integrated circuit 300-1 may include a substrate 310, a plurality of chips 320-1 to 320-8 stacked on the substrate 310, and a plurality of interconnects that electrically connect each of a plurality of circuits included in each of the plurality of chips 320-1 to 320-8 to the substrate 310.

The plurality of chips 320-1 to 320-8 may be implemented such that up to eight identical single chips may be stacked in a first direction (e.g., a +z direction). However, this is only an example, and more than eight chips may be stacked in the first direction (e.g., a +z direction). Furthermore, in one or more examples, a plurality of stacked chips may be further added in a second direction and a third direction (e.g., a +x direction and a +y direction). For example, eight stacked chips may be further added in the third direction (e.g., the +y direction), and accordingly, a total of 16 chips may be disposed in an integrated circuit 300-2.

Figure 3B:
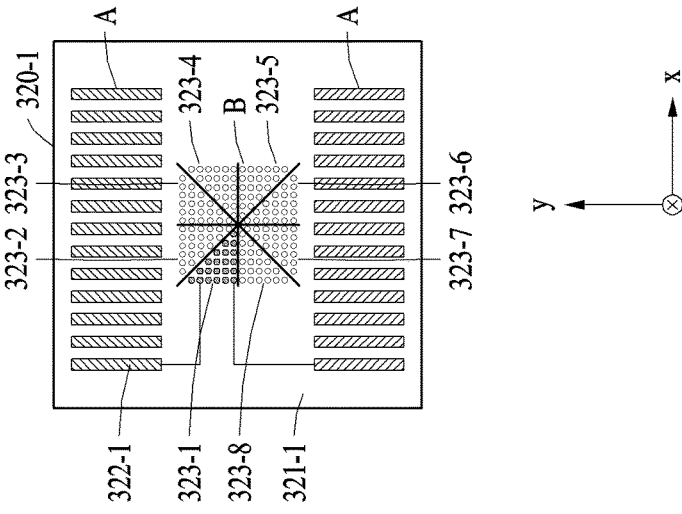
FIG. 3B is a front view of an example integrated circuit, in accordance with one or more embodiments.
Figure 3B:
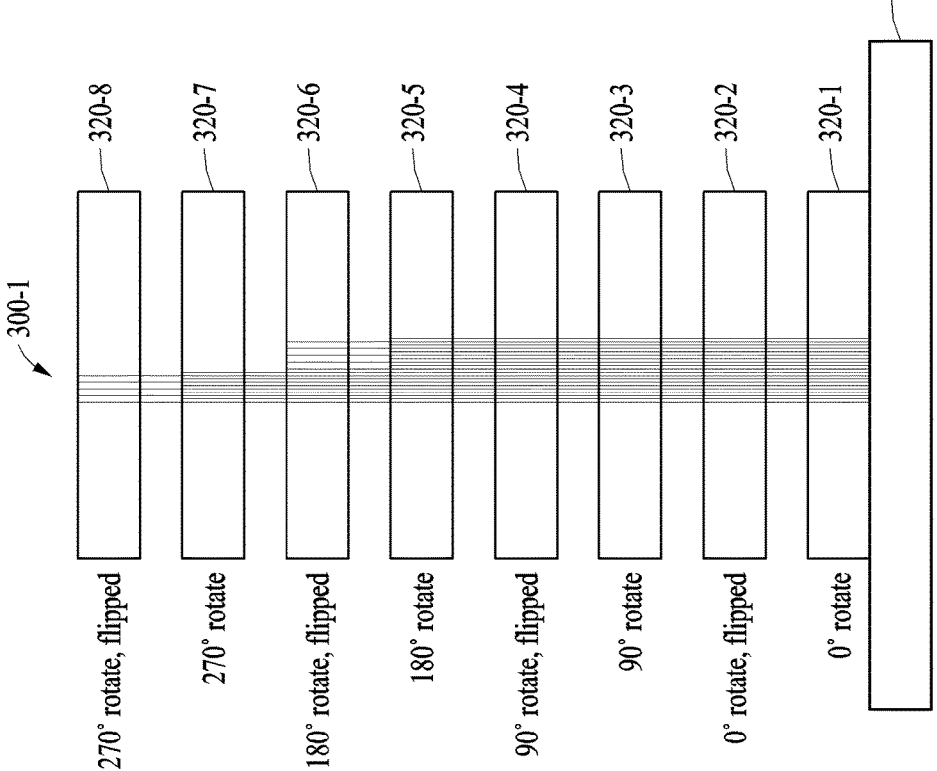

FIG. 3B illustrates a front view of an example integrated circuit, in accordance with one or more embodiments.

Referring to FIG. 3B, all of the plurality of chips 320-1 to 320-8 of the integrated circuit 300-1 may be identical chips. The plurality of chips 320-1 to 320-8, which may have identical structures and components, may rotate and/or flip to be stacked in the integrated circuit 300-1.

Since the plurality of chips 320-1 to 320-8 may have identical structures and components, a structure and components of a chip will be described with reference to the chip 320-1 for ease of description. The chip 320-1 may include a chip body 321-1 including a first area A and a second area B, and 26 circuits 322-1 may be disposed in the first area of the chip body 321-1 and may be connected to 26 interconnects. Although FIG. 3B illustrates 26 circuits 322-1 and 26 interconnects, this is merely an example, and the number of circuits and the number of interconnects may be varied.

The second area B may be virtually divided into a plurality of split areas, and a plurality of interconnects and a plurality of circuits may be connected in a connecting area corresponding to one of the plurality of split areas.

In an example, a second area B of each of the plurality of chips 320-1 to 320-8, which may be implemented to be stacked up to eight chips, may be virtually divided into eight split areas 323-1 to 323-8, and the 26 interconnects and 26 circuits 322-1 may be connected one-to-one in the connecting area 323-1 corresponding to one of the eight split areas 323-1 to 323-8.

The plurality of chips 320-1 to 320-8 may rotate and/or flip to be stacked such that connecting areas 323-1 do not overlap each other. Flip may refer to an operation in which a chip flips with respect to a preset axis (e.g., y=−x axis).

In an example, when the first chip 320-1 to the eighth chip 320-8 are stacked in a first direction (e.g., a +z direction) and the first chip 320-1 is rotated and flipped by 0 degrees, the second chip 320-2 may be flipped to be stacked, the third chip 320-3 may be rotated by 90 degrees to be stacked, the fourth chip 320-4 may be rotated by 90 degrees and flipped to be stacked, the fifth chip 320-5 may be rotated by 180 degrees to be stacked, the sixth chip 320-6 may be rotated by 180 degrees and flipped to be stacked, the seventh chip 320-7 may be rotated by 270 degrees to be stacked, and the eighth chip 320-8 may be rotated by 270 degrees and flipped to be stacked, and thus, the plurality of chips 320-1 to 320-8 may be stacked without the connecting areas 323-1 overlapping each other.

In FIGS. 2A to 3B, a method of stacking identical single chips has been described. However, when stacking different types of multi-chip sets, more chips may be stacked than when a single chip is stacked.

Hereinafter, a method of stacking different types of multi-chip sets will be described in detail with reference to FIG. 4.

Figure 4:
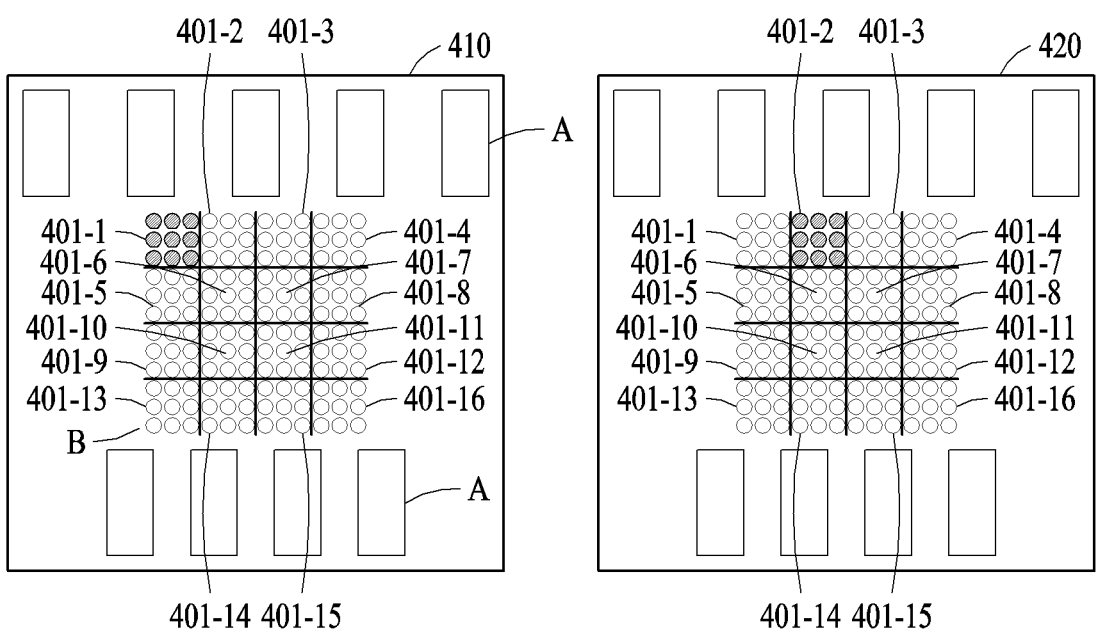
FIG. 4 illustrates an example integrated circuit stacked with a plurality of multi-chip sets, in accordance with one or more embodiments.
Figure 4:
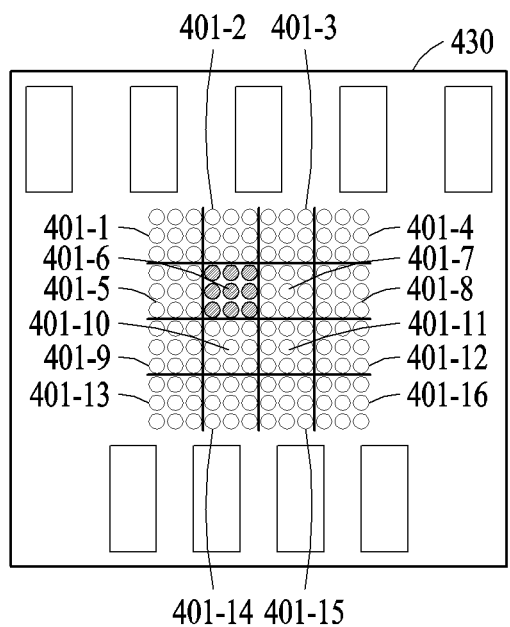

FIG. 4 illustrates an example integrated circuit that is stacked with a plurality of multi-chip sets, in accordance with one or more embodiments.

Referring to FIG. 4, four first multi-chip sets 410, eight second multi-chip sets 420, and four third multi-chip sets 430 may be stacked in an integrated circuit.

The first multi-chip set 410, the second multi-chip set 420, and the third multi-chip set 430 may each include a chip body including a first area A and a second area B and nine circuits disposed in the first area A and connected to nine interconnects. Although FIG. 4 illustrates nine circuits and nine interconnects, this is merely an example, and the number of circuits and the number of interconnects may be varied.

The first multi-chip set 410, the second multi-chip set 420, and the third multi-chip set 430 may respectively have second areas B virtually divided into a plurality of split areas, and a plurality of interconnects and a plurality of circuits may be connected in a connecting area corresponding to one of the plurality of split areas.

In an example, the respective second areas B of the first multi-chip set 410, the second multi-chip set 420, and the third multi-chip set 430 may be virtually divided into 16 split areas 401-1 to 401-16.

In this example, connecting areas may be different depending on a type of a chip. More particularly, the first multi-chip set 410 may have a first split area 401-1 among 16 split areas 401-1 to 401-16 as a connecting area, the second multi-chip set 420 may have a second split area 401-2 as a connecting area, and the third multi-chip set 430 may have a sixth split area 401-6 as a connecting area.

The first multi-chip set 410, the second multi-chip set 420, and the third multi-chip set 430 may each have nine interconnects and nine circuits connected one-to-one in their own connecting area.

The four first multi-chip sets 410, the eight second multi-chip sets 420, and the four third multi-chip sets 430 may rotate and/or flip to be stacked such that connecting areas do not overlap each other.

In an example, when the four first multi-chip sets 410 rotate by 90 degrees to be stacked, connecting areas of the four first multi-chip sets 410 may be disposed in four first areas 401-1, 401-4, 401-13, and 401-16, and when the four third multi-chip sets 430 rotate by 90 degrees to be stacked, connecting areas of the four third multi-chip sets 430 may be disposed in four first areas 401-6, 401-7, 401-10, and 401-11. Furthermore, when the four second multi-chip sets 420 rotate by 90 degrees to be stacked, connecting areas of the four second multi-chip sets 420 may be disposed in four first areas 401-2, 401-8, 401-9, and 401-15, and when the remaining four second multi-chip sets 420 flip with respect to the previously stacked four second multi-chip sets 420 to be stacked, connecting areas of the remaining four second multi-chip sets 420 may be disposed in four areas 401-3, 401-5, 401-12, and 401-14. Accordingly, the four first multi-chip sets 410, the eight second multi-chip sets 420, and the four third multi-chip sets 430 may be stacked without the connecting areas 323-1 overlapping each other.

Figure 5:
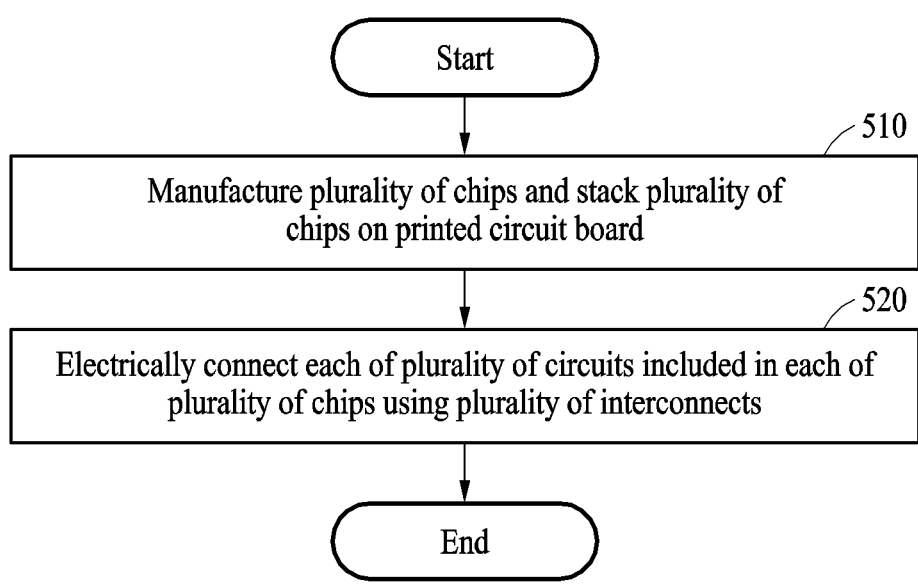
FIG. 5 is a flowchart illustrating a method of manufacturing an integrated circuit, in accordance with one or more embodiments.

FIG. 5 illustrates a flowchart a method of manufacturing an integrated circuit, in accordance with one or more embodiments.

Operations of FIG. 5 may be performed in the order and manner shown. However, the order of some operations may change, or some of the operations may be omitted, without departing from the spirit and scope of the shown example. The operations shown in FIG. 5 may be performed in parallel or simultaneously. In FIG. 5, one or more blocks and a combination thereof may be implemented by a special-purpose hardware-based computer that performs a predetermined function, or a combination of computer instructions and special-purpose hardware. The description of FIGS. 2A to 4 is also applicable to the example of FIG. 5, and thus duplicate descriptions thereof have been omitted.

In operation 510, an integrated circuit manufacturing apparatus may manufacture a plurality of chips and stack the plurality of chips on a substrate. As described above, in an example, the substrate may be a medium that transmits and receives an electrical signal to and from a source external to a chip, and may include a PCB and an electrode array.

In this example, the integrated circuit manufacturing apparatus may stack the plurality of chips such that areas of each of the plurality of chips, to which a plurality of interconnects are connected, do not overlap each other. More particularly, the integrated circuit manufacturing apparatus may rotate or flip each of the plurality of chips to be stacked such that the areas (e.g., connecting areas) of each of the plurality of chips, to which the plurality of interconnects are connected, do not overlap each other, and the plurality of chips may not be connected to each other.

In operation 520, the integrated circuit manufacturing apparatus may electrically connect each of a plurality of circuits included in each of the plurality of chips to the substrate by using a plurality of interconnects. The number of interconnects may be determined based on the number of chips and the number of circuits.

The devices and other components described herein are implemented as, and by, hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods that perform the operations described in this application, and illustrated in FIGS. 2A-5, are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller, e.g., as respective operations of processor implemented methods. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that be performed by the hardware components and the methods as described above. In one example, the instructions or software include machine code that is directly executed by the one or more processors or computers, such as machine code produced by a compiler. In another example, the instructions or software include higher-level code that is executed by the one or more processors or computers using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), EEPROM, RAM, DRAM, SRAM, flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors and computers so that the one or more processors and computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent to one of ordinary skill in the art, after an understanding of the disclosure of this application, that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. An integrated circuit, comprising:
a substrate;
a plurality of chips stacked on the substrate in a first direction, wherein each of the plurality of chips comprises a respective plurality of circuits; and
for each of the plurality of chips, a respective plurality of interconnects configured to electrically connect to the respective plurality of circuits and to the substrate,
wherein the plurality of chips are not electrically connected to each other by the respective plurality of interconnects that connect to the plurality of chips,
wherein each of the plurality of chips includes a respective area where a corresponding chip, of the plurality of chips, connects to the respective plurality of interconnects for the corresponding chip, and
wherein the plurality of chips are stacked such that the respective areas do not overlap with each other in the first direction.

2. The integrated circuit of claim 1, wherein a total number of the respective plurality of interconnects that connect to the plurality of chips is a product of a total number of the plurality of chips and a total number of the respective plurality of circuits of one of the plurality of chips.

3. The integrated circuit of claim 1, wherein the plurality of chips are respectively rotated with respect to a respective other chip, among the plurality of chips, that each of the plurality of chips is adjacent to in the first direction, to arrange the respective areas of each to not overlap with each other in the first direction.

4. The integrated circuit of claim 1, wherein each of the respective plurality of interconnects that connect to the plurality of chips comprises a plurality of through-silicon vias (TSVs).

5. The integrated circuit of claim 1, wherein the plurality of chips comprise identical single chips.

6. The integrated circuit of claim 1, wherein the plurality of chips comprise a plurality of multi-chip sets.

7. A chip, comprising:
a chip body comprising a first area and a second area; and
a plurality of circuits disposed in the first area, and configured to connect to a plurality of interconnects,
wherein the second area is virtually divided into a plurality of split areas, and the plurality of interconnects and the plurality of circuits are connected in a connecting area of the second area corresponding to one of the plurality of split areas.

8. The chip of claim 7, wherein the second area is equally divided into the plurality of split areas.

9. The chip of claim 7, wherein a number of stackable chips corresponds to a number of the plurality of split areas.

10. The chip of claim 7, wherein the plurality of interconnects comprise a plurality of through-silicon vias (TSVs).

* * * * *